(12) United States Patent
Nedovic

(10) Patent No.: US 9,831,861 B2
(45) Date of Patent: Nov. 28, 2017

(54) PHASE DETECTOR

(71) Applicant: FUJITSU LIMITED, Kawasaki-shi, Kanagawa (JP)

(72) Inventor: Nikola Nedovic, San Jose, CA (US)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 14/842,591

(22) Filed: Sep. 1, 2015

(65) Prior Publication Data

US 2017/0063359 A1 Mar. 2, 2017

(51) Int. Cl.
| | |
|---|---|
| *H03L 7/08* | (2006.01) |
| *H03K 5/1534* | (2006.01) |
| *H03L 7/081* | (2006.01) |
| *H03L 7/091* | (2006.01) |

(52) U.S. Cl.
CPC ......... *H03K 5/1534* (2013.01); *H03L 7/0814* (2013.01); *H03L 7/0816* (2013.01); *H03L 7/091* (2013.01)

(58) Field of Classification Search
CPC .................................................. H03K 5/1534
See application file for complete search history.

(56) References Cited

U.S. PATENT DOCUMENTS

| | | | |
|---|---|---|---|
| 5,053,649 A | 10/1991 | Johnson | |
| 6,956,923 B1 | 10/2005 | Younis et al. | |
| 7,092,474 B2 | 8/2006 | Cao | |
| 7,864,911 B2 * | 1/2011 | Chatwin | H03D 13/004 327/244 |

FOREIGN PATENT DOCUMENTS

| | | |
|---|---|---|
| EP | 1294123 B1 | 9/2005 |
| EP | 1894296 B1 | 4/2011 |

OTHER PUBLICATIONS

K. Kanda, H. Tamura, T. Yamamoto, et al., "A Single-40 Gb/s Dual-20 Gb/s Serializer IC with SFI-5.2 Interface in 65 nm CMOS", IEEE JSSC, vol. 44, No. 12, pp. 3580-3589, Dec. 2009.
J. Alexander "Clock recovery from random binary signals", Electronic Letters, vol. 111, pp. 541-542, Oct. 1975 (see fig.).

* cited by examiner

*Primary Examiner* — Hai L Nguyen
(74) *Attorney, Agent, or Firm* — Maschoff Brennan

(57) ABSTRACT

A phase detection circuit includes a first sample circuit, a second sample circuit, and a third sample circuit. The first sample circuit may be configured to sample a first signal based on a first phase of a second signal to generate a first sample of the first signal and to output the first sample. The second sample circuit may be configured to sample the first signal based on a second phase of the second signal to generate a second sample of the first signal and to output second sample. The third sample circuit coupled to the first sample circuit and to the second sample circuit. The third sample circuit may be configured to sample the first sample based on a change of the second sample to generate a third sample and to output the third sample.

15 Claims, 5 Drawing Sheets

PHASE DETECTOR

FIELD

The present disclosure relates to phase detection circuits.

BACKGROUND

Communication systems may transport large amounts of data between multiple devices, for example, telephones, facsimile machines, computers, servers, television sets, cellular telephones, personal digital assistants, among other devices. Such communication systems may be local area networks (LANs) and/or wide area networks (WANs) that are stand-alone communication systems or interconnected to other LANs and/or WANs that are part of a larger network.

The transportation of data within communication systems may be governed by one or more standards that help to ensure the integrity of data conveyances and fairness of access for data conveyances. In accordance with such standards, many system components and end devices of a communication system transport data via serial transmission paths. Transmission and recovery of information from serial transmissions may use transceiver components that operate at clock speeds equal to or higher than the received serial data rate. The transceiver components may use phase detection circuits to more precisely align clock and data signals for more accurate serialization and deserialization of data streams.

The subject matter claimed herein is not limited to embodiments that solve any disadvantages or that operate only in environments such as those described above. Rather, this background is only provided to illustrate one example technology area where some embodiments described herein may be practiced.

SUMMARY

According to an aspect of an embodiment, a phase detection circuit is disclosed. The phase detection circuit includes a first sample circuit, a second sample circuit, and a third sample circuit. The first sample circuit may be configured to sample a first signal based on a first phase of a second signal to generate a first sample of the first signal and to output the first sample. The second sample circuit may be configured to sample the first signal based on a second phase of the second signal to generate a second sample of the first signal and to output second sample. The third sample circuit coupled to the first sample circuit and to the second sample circuit. The third sample circuit may be configured to sample the first sample based on a change of the second sample to generate a third sample and to output the third sample.

The object and advantages of the embodiments will be realized and achieved at least by the elements, features, and combinations particularly pointed out in the claims.

It is to be understood that both the foregoing general description and the following detailed description are exemplary and explanatory and are not restrictive of the present disclosure, as claimed.

BRIEF DESCRIPTION OF THE DRAWINGS

Example embodiments will be described and explained with additional specificity and detail through the use of the accompanying drawings in which.

DESCRIPTION OF EMBODIMENTS

Some embodiments described herein relate to phase detection circuits. Phase detection circuits may be configured to determine a phase relationship between two signals. For example, phase detection circuits may be configured to determine a phase relationship between a clock signal and a data signal. In these and other embodiments, a determined phase relationship for two signals may indicate whether a first signal is leading or lagging a second signal. In some embodiments, the phase detection circuits may not indicate an amount that the first signal is leading or lagging. Rather, the phase detection circuit may indicate that the first signal is leading or lagging. In some embodiments, a phase detection circuit that indicates a signal is leading or lagging and that does not indicate an amount of the leading or lagging may be referred to as a bang-bang type phase detection circuit.

Some embodiments described in this disclosure relate to a bang-bang type phase detection circuit that includes first, second, and third sample circuits, such as flip-flops. The first and second sample circuits may each be configured to sample a data signal. The first sample circuit may sample the data signal on a falling edge of a clock signal and the second sample circuit may sample the data signal on a rising edge of the clock signal. The third sample circuit may sample an output of the first sample circuit when an output of the second sample circuit includes a rising edge, such as when the output of the second sample circuit changes from a low logic level to a high logic level. An output of the third sample circuit may be used to determine a phase difference between the data signal and the clock signal.

Embodiments of the present disclosure will be explained with reference to the accompanying drawings.

Figure 1:
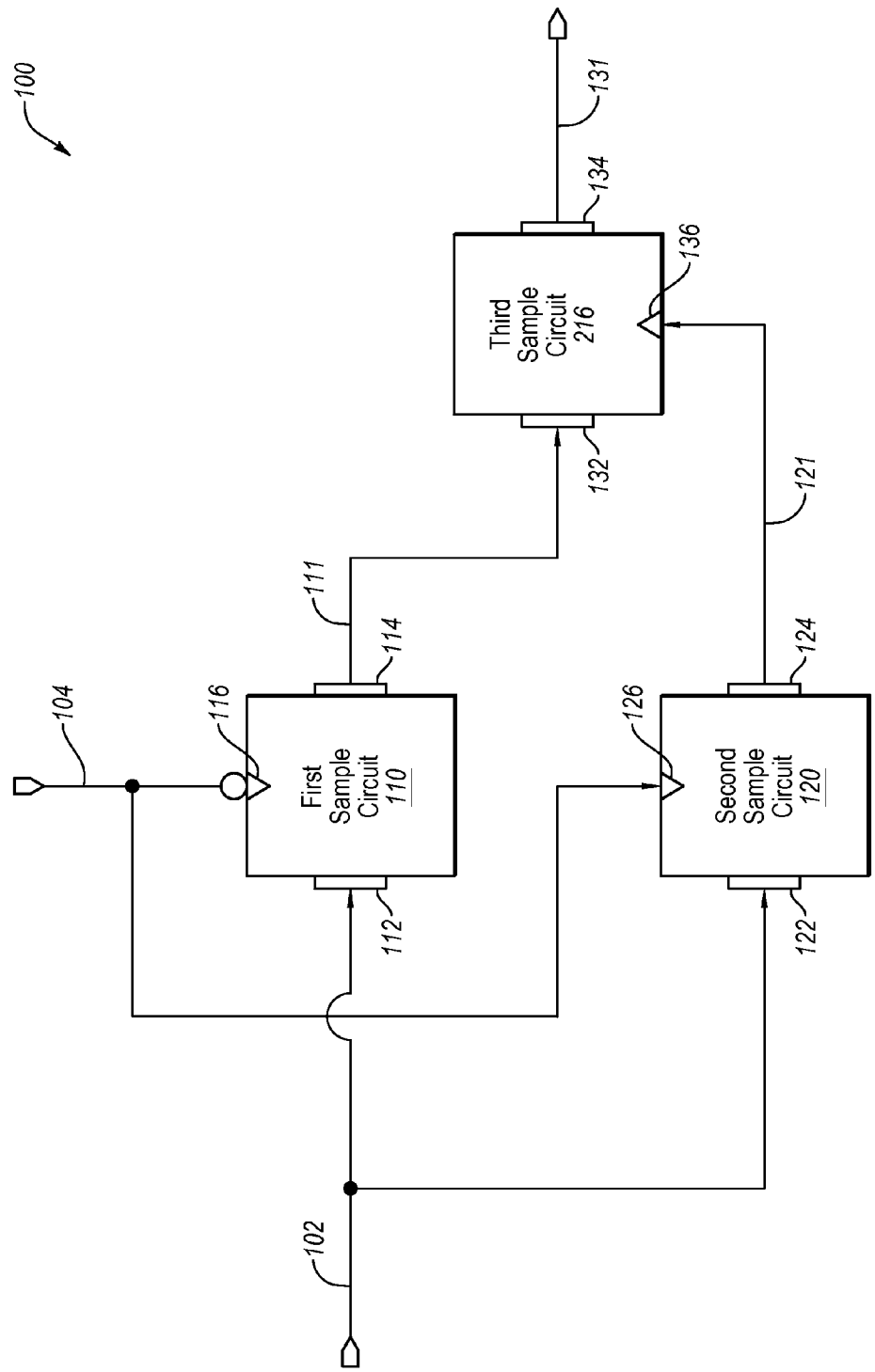
FIG. 1 illustrates an example phase detection circuit.

FIG. 1 illustrates an example phase detection circuit 100 ("the circuit 100"), arranged in accordance with at least one embodiment of the present disclosure. The circuit 100 may include a first sample circuit 110, a second sample circuit 120, and a third sample circuit 130.

The first sample circuit 110 may include a first input port 112, a first output port 114, and a first enable port 116. In some embodiments, the first sample circuit 110 may be triggered to sample an input signal on the first input port 112 based on a clock signal on the first enable port 116. In some embodiments, the first sample circuit 110 may be triggered to sample an input signal on the first input port 112 based on a rising edge, a falling edge, or a logic level of the signal on the first enable port 116. In these and other embodiments, a logic level of the signal on the first input port 112 may be sampled by the first sample circuit 110 based on the signal on the first enable port 116. After sampling the logic level of the signal, the first sample circuit 110 may generate an output signal with the same logic level and output the output signal on the first output port 114.

In some embodiments, the first sample circuit 110 may have a minimum setup time and a minimum hold time to help ensure proper sampling of the logic level of an input signal at the first input port 112. A minimum setup time may be a period in which the logic level of an input signal at the first input port 112 is steady before sampling of the input signal such that the first sample circuit 110 may properly sample the logic level of the input signal. A minimum hold time may be a period in which the logic level of an input signal at the first input port 112 is steady after sampling of the input signal such that the first sample circuit 110 may properly sample the logic level of the input signal. When the minimum setup and/or the minimum hold time is not met when sampling an input signal, the logic level of an output signal of the first sample circuit 110 may not be the same as the logic level of the input signal and may be randomly selected as either a high or a low logic level. For example, if the logic level of an input signal is transitioning when the first sample circuit 110 samples the input signal, the first sample circuit 110 may not accurately sample the logic level of the input signal.

In some embodiments, the second sample circuit 120 may include a second input port 122, a second output port 124, and a second enable port 126 and the third sample circuit 130 may include a third input port 132, a third output port 134, and a third enable port 136. In these and other embodiments, the second sample circuit 120 and the third sample circuit 130 may be configured to operate in a manner analogous to the operation of the first sample circuit 110 as described in this disclosure.

In some embodiments, the first sample circuit 110, the second sample circuit 120, and the third sample circuit 130 may be the same type of sample circuits. For example, the first sample circuit 110, the second sample circuit 120, and the third sample circuit 130 may be triggered sample circuits, such as clocked flip-flops or latches. In some embodiments, the first sample circuit 110 and the second sample circuit 120 may be configured to have the same or similar setup and hold minimum times. In these and other embodiments, the setup and hold minimum times for the third sample circuit 130 may be similar or different than the setup and hold minimum times for the first sample circuit 110 and the second sample circuit 120.

In some embodiments, the first sample circuit 110, the second sample circuit 120, and the third sample circuit 130 may all be edge triggered or clocked sample circuits. In these and other embodiments, the second sample circuit 120 and the third sample circuit 130 may be triggered on the same edge, such as the rising or the falling edge. As used herein, a rising edge may occur when a signal transitions from a low logic level to a high logic level and a falling edge may occur when a signal transitions from a high logic level to the low logic level.

In some embodiments, the first sample circuit 110 and the second sample circuit 120 may be triggered on different edges. For example, if the first sample circuit 110 is triggered on a rising edge, then the second sample circuit 120 may be triggered on a falling edge and vice versa. In these and other embodiments, a clock signal provided to the first sample circuit 110 and the second sample circuit 120 may be phase shifted when provided to the first sample circuit 110. For example, a clock signal provided to the second sample circuit 120 may be phase shifted 180 degrees. As a result, the clock signal provided to the first sample circuit 110 may have a first phase and the clock signal provided to the second sample circuit 120 may have a second phase. In these and other embodiments, the clock signal may be phase shifted by inverting the clock signal.

In some embodiments, the first sample circuit 110, the second sample circuit 120, and the third sample circuit 130 may be differential sample circuits and all of the signals received and output by the first sample circuit 110, the second sample circuit 120, and the third sample circuit 130 may be differential signals. In these and other embodiments, to provide the first sample circuit 110 and the second sample circuit 120 with different phases of a clock signal, the differential signals of the clock signal may be swapped when provided to the first sample circuit 110 as compared to when the clock signal is provided to the second sample circuit 120. By swapping the differential signals of a clock signal or phase shifting the clock signal, the first sample circuit 110 and the second sample circuit 120 may be triggered by opposite edges of the clock signal even though the first sample circuit 110 and the second sample circuit 120 may be the same type of sample circuit. For example, a rising edge of a clock signal may trigger the second sample circuit 120. A falling edge of the same clock signal when inverted or with swapped differential signals may appear to be a rising edge and may trigger the first sample circuit 110.

As illustrated in FIG. 1, the first input port 112 and the second input port 122 may be coupled to an input signal 102. The input signal 102 may be a data signal, a clock signal, or some other type of signal. The first enable port 116 and the second enable port 126 may be coupled to a clock signal 104. As discussed in this disclosure and illustrated in FIG. 1, the first sample circuit 110 may be triggered to sample the input signal 102 at a first phase of the clock signal 104 and the second sample circuit 120 may be triggered to sample the input signal 102 at a second phase of the clock signal 104. In some embodiments, as mentioned, the clock signal 104 may be inverted when received by the first sample circuit 110 or the first sample circuit 110 and the second sample circuit 120 may be triggered with different edges of the clock signal 104.

The first output port 114 may be coupled to the third input port 132 and the second output port 124 may be coupled to the third enable port 136. In these and other embodiments, the first sample circuit 110 may provide its sample of the input signal 102 as a first sample signal 111 to the third input port 132. Likewise, the second sample circuit 120 may provide its sample of the input signal 102 as a second sample signal 121 to the third enable port 136. The third sample circuit 130 may provide a sample of the first sample signal 111 as a third sample signal 131. The third sample signal 131 may represent a phase difference between the input signal 102 and the clock signal 104.

An example of the operation of the circuit 100 follows. The input signal 102 is provided to the first sample circuit 110 and the second sample circuit 120. The first sample circuit 110 samples the input signal 102 at a falling edge of the clock signal 104 and outputs the sample as the first sample signal 111 to the third sample circuit 130. The second sample circuit 120 samples the input signal 102 at the rising edge of the clock signal 104 and outputs the sample as the second sample signal 121 to the third sample circuit 130. The third sample circuit 130 samples the first sample signal 111 when the second sample signal 121 transitions from a low logic level to a high logic level to create a rising edge.

Furthermore, due to the first sample circuit 110 and the second sample circuit 120 sampling the input signal 102 at different phases or edges of the clock signal 104, the first sample signal 111 and the second sample signal 121 may be leading and lagging samples of the input signal 102. For example, if the input signal 102 and the clock signal 104 are not phase aligned, then one of the first sample circuit 110 and the second sample circuit 120 may sample the input signal 102 before a transition of the input signal 102 and another of the first sample circuit 110 and the second sample circuit 120 may sample the input signal 102 after a transition of the input signal 102. As a result, the input signal 102 may be sampled using an edge of the clock signal 104 that is leading the input signal 102 and the input signal 102 may be sampled using an edge of the clock signal 104 that is lagging the input signal 102.

The third sample circuit 130 may be configured to compare the samples of the input signal 102 made using the leading and lagging edges of the clock signal 104 by sampling one of the samples using another of the samples. However, the third sample circuit 130 does not sample the first sample signal 111 and the second sample signal 121 at the same rate that the first sample circuit 110 and the second sample circuit 120 samples the input signal 102. Rather, the third sample circuit 130 samples the first sample signal 111 when the second sample signal 121 transitions from a low logic level to a high logic level to create a rising edge. As a result, the third sample circuit 130 does not sample the first sample signal 111 every time the first sample signal 111 may change. Rather, the third sample circuit 130 samples the first sample signal 111 at an interval that is slower than the sampling interval of the first sample circuit 110. The first sample signal 111 and the second sample signal 121 being leading and lagging samples of the input signal 102 along with the difference in sampling interval by the third sample circuit 130 resulting from sampling the first sample signal 111 with the second sample signal 121 may result in an amplification of a phase difference between the input signal 102 and clock signal 104 and provide the circuit 100 with bang-bang type properties.

In some embodiments, the circuit 100 may be configured such that when the input signal 102 is leading the clock signal 104, the logic level of the third sample signal 131 may maintain at the same logic level, for example a low logic level. Similarly, when the input signal 102 is lagging the clock signal 104, the logic level of the third sample signal 131 may maintain at the same logic level, for example a high logic level. The third sample signal 131 maintaining or substantially maintaining a same logic level may indicate a phase difference between the input signal 102 and the clock signal 104. Furthermore, the logic level being maintained or substantially maintained may indicate whether the input signal 102 is leading or lagging the clock signal 104. In some embodiments, the third sample signal 131 may not indicate an amount that the input signal 102 is leading or lagging the clock signal 104, but rather just that the input signal 102 is leading or lagging the clock signal 104.

An example of the operation of the circuit 100 with the input signal 102 lagging is now provided. Assume that the input signal 102 is operating at half the frequency of the clock signal 104 and that the input signal 102 has an approximately fifty percent duty cycle. Further assume that a rising edge of the input signal 102 is lagging a rising edge of the clock signal 104. The input signal 102 may be a low logic level at a rising edge of the clock signal 104 and may be sampled by the second sample circuit 120. Thus, the second sample signal 121 may be a low logic level. Before the clock signal 104 falls, the input signal 102 may transition to a high logic level. At the falling edge of the clock signal 104, the first sample circuit 110 may sample the input signal 102 at a high logic level. Thus, the first sample signal 111 may be a high logic level. The clock signal 104 may rise before the transition of the input signal 102 to a low logic level. As a result, the second sample circuit 120 may sample the input signal 102 at the high logic level. Thus, the second sample signal 121 may change to a high logic level causing a rising edge on the third enable port 136 of the third sample circuit 130 such that the third sample circuit 130 samples the first sample signal 111 which is at a high logic level. Thus, the third sample signal 131 may be a high logic level.

The input signal 102 may transition to a low logic level before the next edge of the clock signal 104. At the next edge of the clock signal 104, the falling edge, the first sample circuit 110 samples the input signal 102 and changes the first sample signal 111 to a low logic level. At the next edge of the clock signal 104, the rising edge, the second sample circuit 120 samples the input signal 102 and changes the second sample signal 121 to a low logic level. The falling edge of the second sample signal 121 does not result in the third sample circuit 130 sampling the first sample signal 111. The input signal 102 may then transition to a high logic level before the next edge of the clock signal 104. The next edge of the clock signal 104 may be a falling edge such that the first sample circuit 110 samples the input signal 102 and changes the first sample signal 111 to a high logic level. At the next rising edge of the clock signal 104 before the transition of the input signal 102, the second sample circuit 120 samples the input signal 102 and changes the second sample signal 121 to a high logic level. Changing the second sample signal 121 to a high logic level may cause a rising edge at the third enable port 136 such that the third sample circuit 130 samples the first sample signal 111 and maintains the third sample signal 131 at a high logic level.

In some embodiments, when a phase difference exists between the input signal 102 and the clock signal 104 the first sample circuit 110 may be in metastable state, resulting in the third sample signal 131 exhibiting the logic levels described above.

In some embodiments, when the input signal 102 is in phase and in other phase conditions with the clock signal 104, the first sample circuit 110 and/or the second sample circuit 120 may not be in a metastable state because the input signal 102 and the clock signal 104 may be changing logic levels at approximately the same time such that the setup and/or hold minimum times of the first sample circuit 110 and/or the second sample circuit 120 may not be met. In these and other embodiments, the first sample circuit 110 may generate random or pseudo-random logic levels for the first sample signal 111. The random or pseudo-random logic levels may result in random or pseudo-random logic levels of the third sample signal 131. Random or pseudo-random logic levels of the third sample signal 131, such as the third sample signal 131 changing between logic levels may indicate that the input signal 102 and the clock signal 104 are substantially in phase or 180 degrees out of phase.

Modifications, additions, or omissions may be made to the circuit 100 without departing from the scope of the present disclosure. For example, in some embodiments, the second sample circuit 120 may be falling edge triggered and the first sample circuit 110 may be rising edge triggered.

Figure 2:
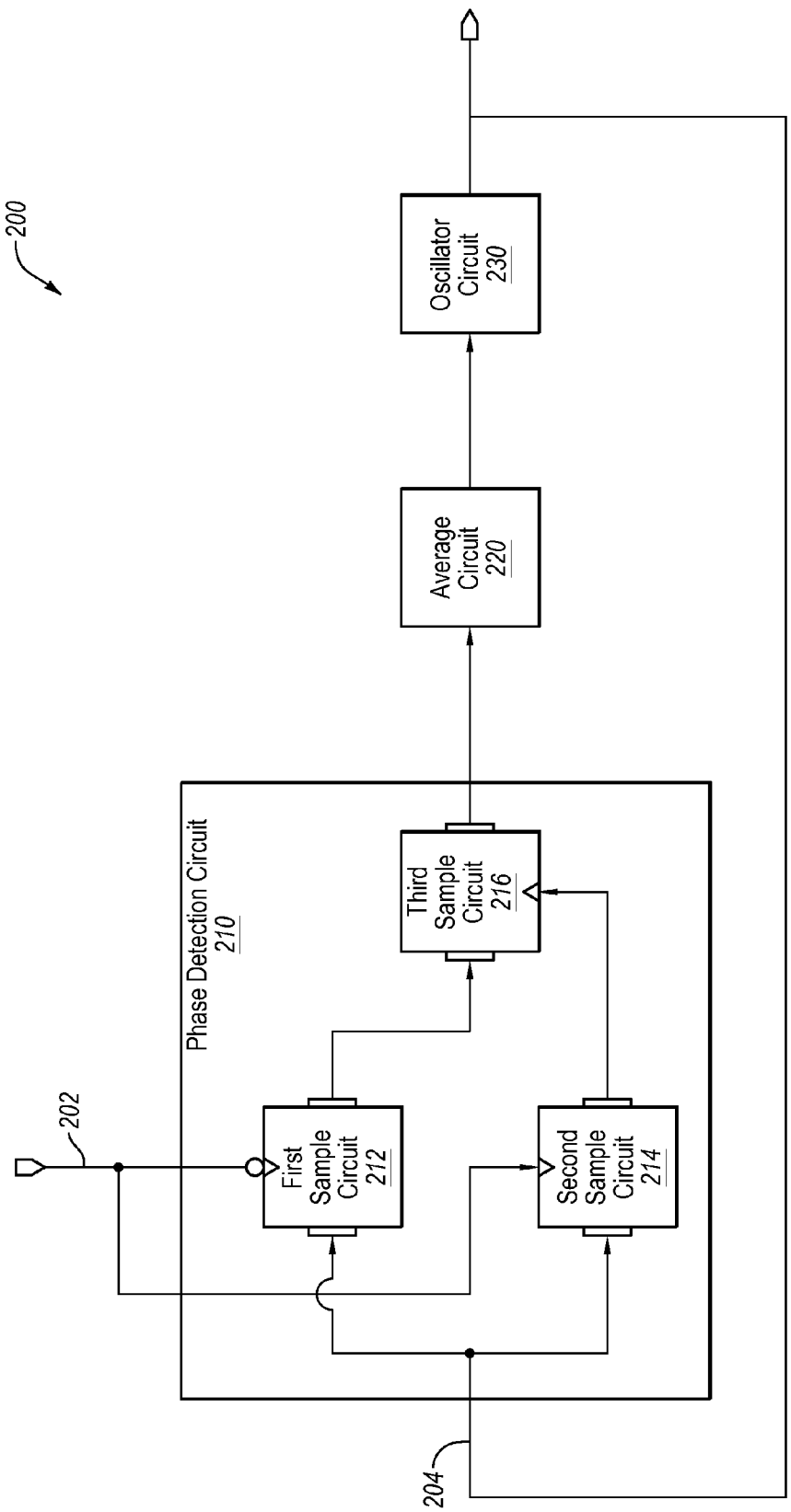
FIG. 2 illustrates an example phase-lock-loop circuit that includes the example phase detection circuit of FIG. 1.

FIG. 2 illustrates an example phase-lock-loop circuit 200 ("the circuit 200"), arranged in accordance with at least one embodiment of the present disclosure. The circuit 200 may include a phase detection circuit 210, an average circuit 220, and an oscillator circuit 230 that may be arranged in a phase-lock-loop configuration.

The phase detection circuit 210 may include a first sample circuit 212, a second sample circuit 214, and a third sample circuit 216. The phase detection circuit 210 may be analogous to the circuit 100 of FIG. 1. In these and other embodiments, the first sample circuit 212 may be analogous to the first sample circuit 110, the second sample circuit 214 may be analogous to the second sample circuit 120, and the third sample circuit 216 may be analogous to the third sample circuit 130.

In some embodiments, the phase detection circuit 210 may be configured to determine a phase difference between a clock signal 202 and an output signal 204. The phase detection circuit 210 may output a third sample signal from the third sample circuit 216 that may indicate if the output signal 204 is leading or lagging the clock signal 202. For example, the third sample signal may be a first logic level when the output signal 204 is leading the clock signal 202. Alternately or additionally, the third sample signal may be second logic level when the output signal 204 is lagging the clock signal 202.

The average circuit 220 may be coupled to the phase detection circuit 210. In particular, the average circuit 220 may be configured to receive an output of the third sample circuit 216. The average circuit 220 may be configured to average the logic levels of the third sample signal output by the third sample circuit 216. The average of the logic levels of the third sample signal may be a control signal that may be provided to the oscillator circuit 230. The control signal may indicate whether the output signal 204 is leading or lagging the clock signal 202. For example, the control signal at a high logic level may indicate that the output signal 204 is lagging the clock signal 202. Alternately or additionally, the control signal at a low logic level may indicate that the output signal 204 is leading the clock signal 202. Alternately or additionally, the control signal at a level between a high logic level and a low logic level may indicate that the output signal 204 and the clock signal 202 are substantially in phase.

An example of the operation of the average circuit 220 follows. When the output signal 204 is lagging the clock signal 202, the third sample signal may be at a consistent high logic level. As a result, the average of the third sample signal may be at a high logic level. When the output signal 204 is leading the clock signal 202, the third sample signal may be at a consistent low logic level. As a result, the average of the third sample signal may be a low logic level. When the output signal 204 is substantially in phase with the clock signal 202, the third sample signal may be a random or pseudo random distribution of high logic levels and low logic levels. As a result, the average of the third sample signal may be a level between a high logic level and a low logic level.

In some embodiments, the average circuit 220 may be an analog circuit. In these and other embodiments, the average circuit 220 may include a charge pump circuit and a filter circuit. The charge pump circuit may be configured to receive the third sample signal. When the third sample signal is a high logic level, the charge pump circuit may push current to the filter circuit. When the third sample signal is a low logic level, the charge pump circuit may pull current from the filter circuit. The filter circuit may include a capacitance that integrates the amount of current over time to generate the control signal, which may be an average of the current and thus an average of the third sample signal.

In some embodiments, the average circuit 220 may be a digital filter circuit. In these and other embodiments, the digital filter circuit may average the third sample signal over time to generate the control signal.

The oscillator circuit 230 may be coupled to the average circuit 230 and may be configured to generate the output signal 204 based on the control signal. For example, the oscillator circuit 230 may be configured to adjust a phase or frequency of the output signal 204 based on a level of the control signal.

As an example, when the control signal indicates that the output signal 204 is lagging the clock signal 202, the oscillator circuit 230 may increase the frequency or adjust the phase of the output signal 204 until the phase of the output signal 204 and the clock signal 202 are substantially the same. Alternately or additionally, when the control signal indicates that the output signal 204 is leading the clock signal 202, the oscillator circuit 230 may decrease the frequency or adjust the phase of the output signal 204 until the phase of the output signal 204 and the clock signal 202 are substantially the same.

Modifications, additions, or omissions may be made to the circuit 200 without departing from the scope of the present disclosure. For example, in some embodiments, the circuits 200 may include a divider circuit between the oscillator circuit 230 and the phase detection circuit 210. In these and other embodiments, the divider circuit may adjust the frequency of the output signal 204 output by the oscillator circuit 230 before the output signal 204 is received by the phase detection circuit 210 to allow the frequency of the output signal 204 to be different from the frequency of the clock signal 202. Alternately or additionally, in some embodiments, the clock signal 202 may be provided to the input ports of the first sample circuit 212 and the second sample circuit 214 and the output signal 204 may be provided to the enable ports of the first sample circuit 212 and the second sample circuit 214. In these and other embodiments, the average circuit 220 may also be adjusted based on a desired polarity of the circuit 200.

Figure 3:
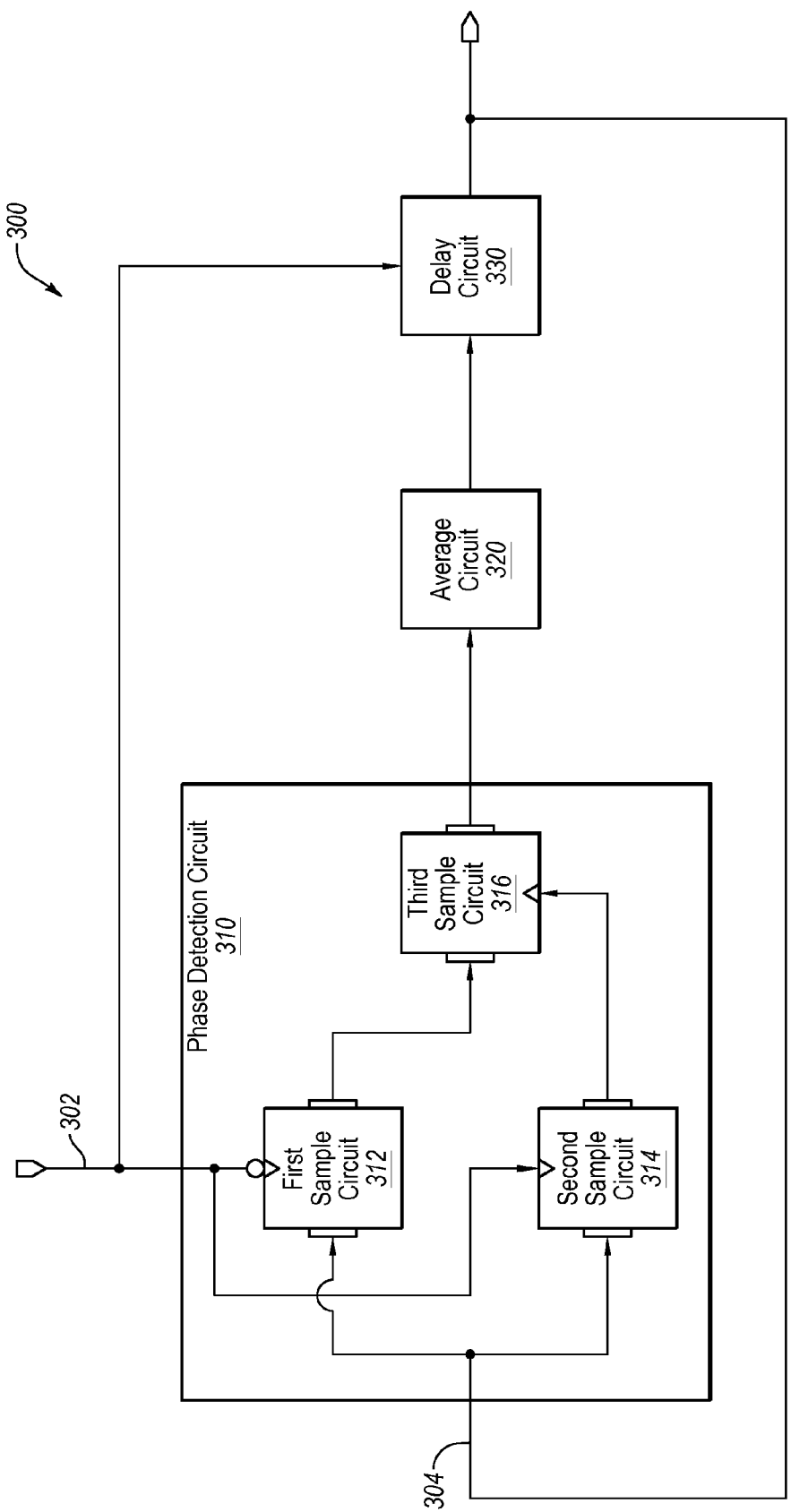
FIG. 3 illustrates an example delay-lock-loop circuit that includes the example phase detection circuit of FIG. 1.

FIG. 3 illustrates an example delay-lock-loop circuit 300 ("the circuit 300"), arranged in accordance with at least one embodiment of the present disclosure. The circuit 300 may include a phase detection circuit 310, an average circuit 320, and a delay circuit 330 that may be arranged in a delay-lock-loop configuration.

The phase detection circuit 310 may include a first sample circuit 312, a second sample circuit 314, and a third sample circuit 316. The phase detection circuit 310 may be analogous to the circuit 100 of FIG. 1. In these and other embodiments, the first sample circuit 312 may be analogous to the first sample circuit 110, the second sample circuit 314 may be analogous to the second sample circuit 120, and the third sample circuit 316 may be analogous to the third sample circuit 130.

In some embodiments, the phase detection circuit 310 may be configured to determine a phase difference between a clock signal 302 and an output signal 304. The phase detection circuit 310 may output a third sample signal from the third sample circuit 316 that may indicate if the output signal 304 is leading or lagging the clock signal 302. For example, the third sample signal may be a first logic level when the output signal 304 is leading the clock signal 302. Alternately or additionally, the third sample signal may be a second logic level when the output signal 304 is lagging the clock signal 302.

The average circuit 320 may be coupled to the phase detection circuit 310. The average circuit 320 may be configured to receive an output of the third sample circuit 316. The average circuit 320 may be configured to average the logic level of the third sample signal output by the third sample circuit 316. The average of the logic levels of the third sample signal may be a control signal that may be provided to the delay circuit 330. The control signal may indicate whether the output signal 304 is leading or lagging the clock signal 302. In some embodiments, the average circuit 320 may be analogous to the average circuit 220 of FIG. 2.

The delay circuit 330 may be coupled to an output of the average circuit 320. The delay circuit 330 may be configured to receive the control signal from the average circuit 320 and the clock signal 302. The delay circuit 330 may be configured to adjust a delay applied to the clock signal 302 based on the control signal. The delay circuit 330 may output the delayed clock signal 302 as the output signal 304.

As an example, when the control signal indicates that the output signal 304 is lagging the clock signal 302, the delay circuit 330 may increase the delay of the output signal 304 until the phase of the output signal 304 and the clock signal 302 are substantially the same. Alternately or additionally, when the control signal indicates that the output signal 304 is leading the clock signal 302, the delay circuit 330 may decrease the delay of the output signal 304 until the phase of the output signal 304 and the clock signal 302 are substantially the same. Modifications, additions, or omissions may be made to the circuit 300 without departing from the scope of the present disclosure.

Figure 4:
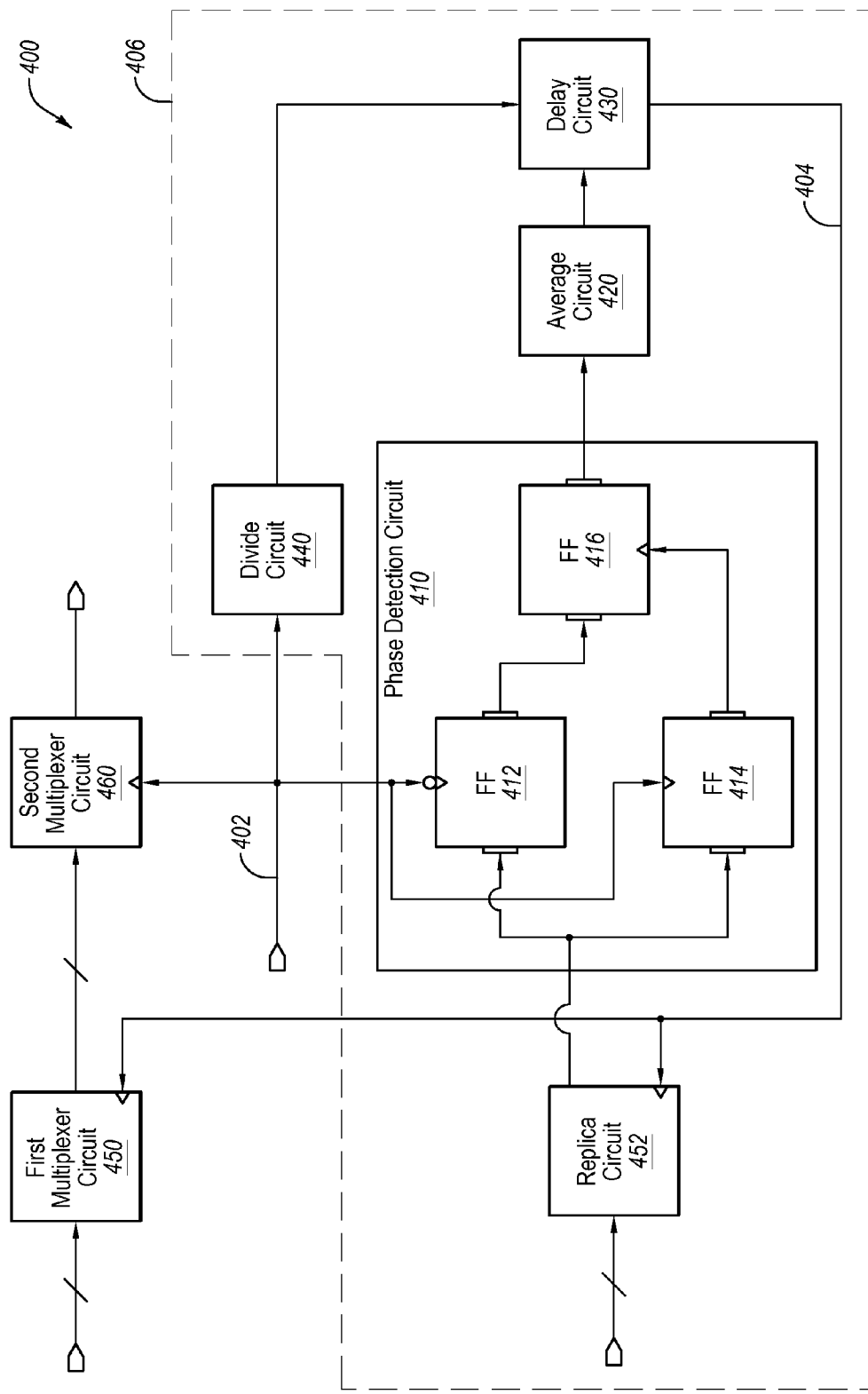
FIG. 4 illustrates an example serializer circuit that includes the example phase detection circuit of FIG. 1.

FIG. 4 illustrates an example serializer circuit 400 ("the circuit 400"), arranged in accordance with at least one embodiment of the present disclosure. The circuit 400 may include a first multiplexer circuit 450, a second multiplexer circuit 460, and an adjust circuit 406.

The first multiplexer circuit 450 may be configured to receive data signals. The data signals may be parallel data signals in that the data signal provide data at approximately the same data rate in a parallel manner. The first multiplexer circuit 450 may be configured to generate a first combined data signal based on half of the data signals. In some embodiments, the first multiplexer circuit 450 may be configured to multiplex the first and second data signals into the first combined data signal based on logical high and low levels of a second clock signal 404 received from the adjust circuit 406. For example, the first combined data signal may be formed by interweaving alternate data symbols from the first and second data signals. In some embodiments, the first combined data signal may have a data rate that is twice the data rate of the first and second data signals.

The first multiplexer circuit 450 may be further configured to generate a second combined data signal based on other of the data signals. The first multiplexer circuit 450 may generate the second combined data signal in a similar manner as described with respect to the generation of the first combined data signal. The first and second combined data signals may be parallel data signals in that they provide data at approximately the same data rate in a parallel manner. The data rate of the first and second combined data signals may be approximately equal or equal to the clock rate of the second clock signal 404. The first multiplexer circuit 450 may output the first and second combined data signals to the second multiplexer circuit 460 when triggered by the second clock signal 404.

The second multiplexer circuit 460 may be configured to receive the first and second combined data signals. The second multiplexer circuit 460 may be configured to generate a third combined data signal based on the first and second combined data signals. In particular, the second multiplexer circuit 460 may be configured to multiplex the first and second combined data signals into the third combined data signal based on logical high and low levels of a first clock signal 402. For example, the third combined data signal may be formed by interweaving alternate data symbols from the first and second combined data signals. In some embodiments, the third combined data signal may have a data rate that is twice the data rate of the first and second combined data signals. The second multiplexer circuit 460 may output the third combined data signal.

The adjust circuit 406 may be configured to generate the second clock signal 404 based on the first clock signal 402. The second clock signal 404 may have a clock rate that is approximately half of the clock rate of the first clock signal 402. Furthermore, the adjust circuit 406 may be configured to adjust a phase of the second clock signal 404 in relation to the phase of the first clock signal 402. In particular, the adjust circuit 406 may be configured to adjust the phase of the second clock signal 404 with respect to the phase of the first clock signal 402 such that the first multiplexer circuit 450 outputs the first and second combined data signals so that an approximate middle of the data symbols of the first and second combined data signals arrive at the second multiplexer circuit 460 when a rising edge of the first clock signal 402 arrives at the second multiplexer circuit 460.

Furthermore, the adjust circuit 406 may be configured to detect when the approximate middle of the data symbols of the first and second combined data signals are not aligned with the rising edge of the first clock signal 402 when received at the second multiplexer circuit 460. In response to the approximate middle of the data symbols of the first and second combined data signals not being aligned with the rising edge of the first clock signal 402, the adjust circuit 406 may be configured to adjust the second clock signal 404. In some embodiments, aligning the approximate a middle of the data symbols of the first and second combined data signals with the rising edge of the first clock signal 402 may facilitate the ability of the second multiplexer circuit 460 to generate the third combined data signal.

The adjust circuit 406 may include a phase detection circuit 410, an average circuit 420, a delay circuit 430, a divide circuit 440, and a replica circuit 452. In these and other embodiments, the adjust circuit 406 may be configured to detect when the approximate middle of the data symbols of the first and second combined data signals are not aligned with an edge of the first clock signal 402 when received at the second multiplexer circuit 460 using the replica circuit 452 and the phase detection circuit 410.

The replica circuit 452 may be an analogous circuit in operation to the first multiplexer circuit 450. As a result, in these and other embodiments, the replica circuit 452 may have a similar or the same functionality, design, circuit layout, and manufacturing process as the first multiplexer circuit 450. Because the replica circuit 452 is a replica of the first multiplexer circuit 450 and may be clocked using the second clock signal 404, the replica circuit 452 may output a replica output signal with a similar or the same timing as the first multiplexer circuit 450 outputs the first and second combined signals. In these and other embodiments, the replica circuit 452 may generate the replica output signal by multiplexing a high logic level signal and a low logic level signal to generate a signal with a fifty percent duty cycle analogous to a clock signal. The replica output signal may be provided to the phase detection circuit 410.

The phase detection circuit 410 may include a first flip-flop circuit 412, a second flip-flop circuit 414, and a third flip-flop circuit 416. The phase detection circuit 410 may be analogous to the circuit 100 of FIG. 1. In these and other embodiments, the first flip-flop circuit 412 may be analogous to the first sample circuit 110, the second flip-flop circuit 414 may be analogous to the second sample circuit 120, and the third flip-flop circuit 416 may be analogous to the third sample circuit 130.

In some embodiments, the phase detection circuit 410 may be configured to determine a phase difference between a falling edge of the first clock signal 402 and the replica output signal output by the replica circuit 452. Note that when the falling edge of the first clock signal 402 is aligned with a rising edge of the replica output signal that a middle of data symbols of the replica output signal may be aligned with a rising edge of the first clock signal 402. Thus, if the replica output signal is leading or lagging a falling edge of the first clock signal 402, a middle of the data symbols of the first and second combined data signals may be leading or lagging a rising edge of the first clock signal 402.

The phase detection circuit 410 may output a third sample signal from the third flip-flop circuit 416 that may indicate if the replica output signal is leading or lagging a falling edge of the first clock signal 402. The third sample signal may be provided to the average circuit 420.

The average circuit 420 may be coupled to the phase detection circuit 410. The average circuit 420 may be configured to receive the third sample signal of the third flip-flop circuit 416. The average circuit 420 may be configured to average the logic levels of the third sample signal output by the third flip-flop circuit 416. The average of the logic levels of the third sample signal may be a control signal that may be provided to the delay circuit 430.

The divide circuit 440 may divide the first clock signal 402 to generate a divided clock signal that is one-half the frequency of the first clock signal 402 and equal to the frequency of the second clock signal 404. The divided clock signal may be provided to the delay circuit 430. The delay circuit 430 may be configured to adjust a phase of the divided clock signal based on the control signal from the average circuit 420 by delaying the divided clock signal. The delayed divided clock signal is output by the delay circuit 430 as the second clock signal 404.

Thus, the replica circuit 452, the phase detection circuit 410, the average circuit 420, and the delay circuit 430 may form a delay-locked-loop that may act to bring the phase of the second clock signal 404 such that the approximate middle of the data symbols of the first and second combined data signals output by the first multiplexer circuit 450 are approximately aligned with the rising edge of the first clock signal 402.

Modifications, additions, or omissions may be made to the circuit 400 without departing from the scope of the present disclosure. For example, in some embodiments, the circuit 400 may not include the replica circuit 452. In these and other embodiments, either one of the first and second combined data signals may be provided to the phase detection circuit 410. Alternately or additionally, the second multiplexer circuit 460 may be clocked on a falling edge of the first clock signal 402. In these and other embodiments, the first flip-flop circuit 412 may be rising edge triggered and the second flip-flop circuit 414 may be negative edge triggered.

Figure 5:
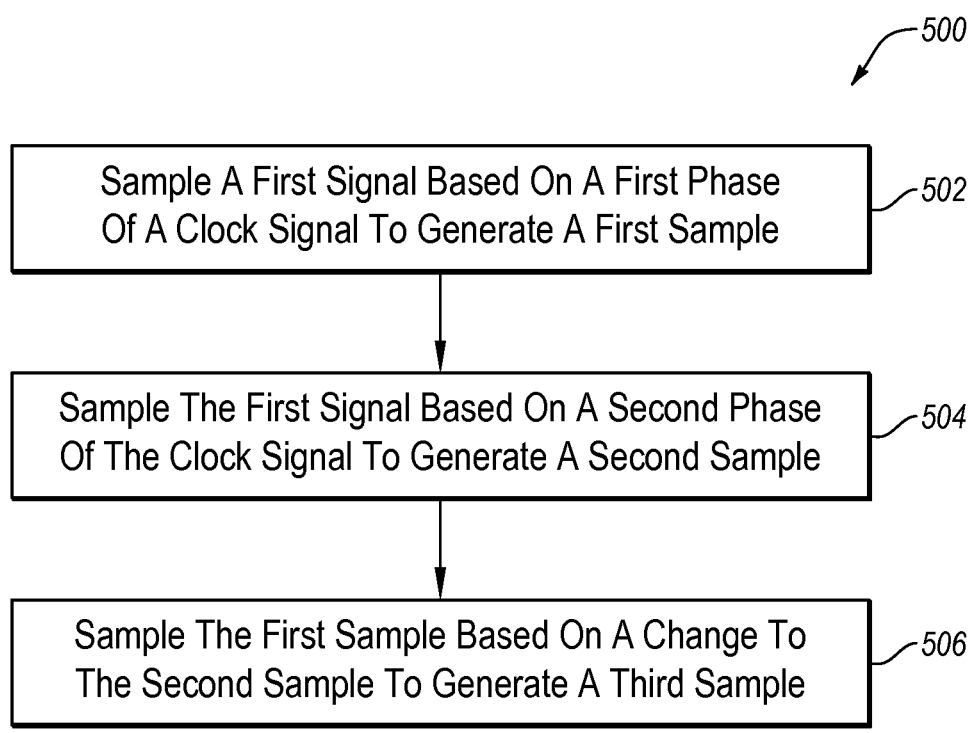
FIG. 5 is a flow chart of an example method of phase difference detection.

FIG. 5 is a flow chart of an example method 500 of phase difference detection, which may be arranged in accordance with at least one embodiment described herein. The method 500 may be implemented, in some embodiments, by a circuit, such as one of the circuits 100, 200, 300, or 400 of FIGS. 1, 2, 3, and 4. Although illustrated as discrete blocks, various blocks may be divided into additional blocks, combined into fewer blocks, or eliminated, depending on the desired implementation.

The method 500 may begin at block 502, where a first signal may be sampled based on a first phase of a clock signal to generate a first sample. In some embodiments, the first signal may be approximately one-half the frequency of the clock signal.

In block 504, the first signal may be sampled based on a second phase of the clock signal to generate a second sample. In some embodiments, a difference between the first phase of the clock signal and the second phase of the clock signal may be 180 degrees. As a result, in these and other embodiments, the first sample may be sampled on one of a rising edge or a falling edge of the clock signal and the second sample may be sampled on the other of the rising edge or the falling edge of the clock signal.

In block 506, the first sample may be sampled based on a change to the second sample to generate a third sample. In some embodiments, the change of the second sample may be a change from a first logic level to a second logic level of the second sample.

One skilled in the art will appreciate that, for this and other processes and methods disclosed herein, the functions performed in the processes and methods may be implemented in differing order. Furthermore, the outlined steps and operations are only provided as examples, and some of the steps and operations may be optional, combined into fewer steps and operations, or expanded into additional steps and operations without detracting from the essence of the disclosed embodiments.

For example, the method 500 may further include averaging the third sample over time and adjusting a phase relationship between the first signal and the clock signal based on the average of the third sample. In these and other embodiments, adjusting the phase relationship may include delaying the first signal or adjusting a generation of the first signal. Alternately or additionally, adjusting the phase relationship may include adjusting a second clock signal that triggers an output of the first signal.

Terms used herein and especially in the appended claims (e.g., bodies of the appended claims) are generally intended as "open" terms (e.g., the term "including" should be interpreted as "including, but not limited to," the term "having" should be interpreted as "having at least," the term "includes" should be interpreted as "includes, but is not limited to," etc.).

Additionally, if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations.

In addition, even if a specific number of an introduced claim recitation is explicitly recited, those skilled in the art will recognize that such recitation should be interpreted to mean at least the recited number (e.g., the bare recitation of "two recitations," without other modifiers, means at least two recitations, or two or more recitations). Furthermore, in those instances where a convention analogous to "at least one of A, B, and C, etc." or "one or more of A, B, and C, etc." is used, in general such a construction is intended to include A alone, B alone, C alone, A and B together, A and C together, B and C together, or A, B, and C together, etc. For example, the use of the term "and/or" is intended to be construed in this manner.

Further, any disjunctive word or phrase presenting two or more alternative terms, whether in the description of embodiments, claims, or drawings, should be understood to contemplate the possibilities of including one of the terms, either of the terms, or both terms. For example, the phrase "A or B" should be understood to include the possibilities of "A" or "B" or "A and B."

All examples and conditional language recited herein are intended for pedagogical objects to aid the reader in understanding the invention and the concepts contributed by the inventor to furthering the art, and are to be construed as being without limitation to such specifically recited examples and conditions. Although embodiments of the present disclosure have been described in detail, it should be understood that various changes, substitutions, and alterations could be made hereto without departing from the spirit and scope of the present disclosure.

What is claimed is:

1. A circuit comprising:
   a phase detection circuit comprising:
      a first flip-flop circuit configured to sample a first signal on one of either a rising or a falling edge of a clock signal to generate a first sample of the first signal and to output the first sample;
      a second flip-flop circuit configured to sample the first signal on the other of the rising or the falling edge of the clock signal to generate a second sample of the first signal and to output the second sample; and
      a third flip-flop circuit coupled to the first flip-flop circuit and to the second flip-flop circuit, the third flip-flop circuit configured to sample the first sample on a change of the second sample from a first logic level to a second logic level to generate a third sample and to output the third sample; and
   an adjust circuit coupled to the phase detection circuit, the adjust circuit including an average circuit and an oscillator circuit and being configured to adjust, based on the third sample, a phase of the first signal provided to the first flip-flop circuit and the second flip-flop circuit.

2. The circuit of claim 1, wherein the first signal is approximately one-half the frequency of the clock signal.

3. The circuit of claim 1, wherein a set-up and hold time for the first flip-flop circuit and the second flip-flop circuit are approximately the same.

4. A method of phase difference detection, the method comprising:
   sampling a first signal based on a first phase of a clock signal to generate a first sample;
   sampling the first signal based on a second phase of the clock signal to generate a second sample;
   sampling the first sample based on a change to the second sample to generate a third sample; and
   adjusting, based on the third sample, a phase of the first signal that is sampled based on the first and second phases of the clock signal.

5. The method of claim 4, further comprising
averaging the third sample over time, wherein the phase of the first signal is adjusted based on the averaged third sample.

6. The method of claim 4, wherein adjusting the phase of the first signal includes delaying the first signal or adjusting a generation of the first signal.

7. The method of claim 4, wherein a difference between the first phase of the clock signal and the second phase of the clock signal is 180 degrees such that the first sample is sampled on one of a rising edge or a falling edge of the clock signal and the second sample is sampled on the other of the rising edge or the falling edge of the clock signal.

8. The method of claim 4, wherein the first signal is approximately one-half the frequency of the clock signal.

9. A circuit comprising:
   a phase detection circuit comprising:
      a first sample circuit configured to sample a first signal based on a first phase of a second signal to generate a first sample of the first signal and to output the first sample;
      a second sample circuit configured to sample the first signal based on a second phase of the second signal to generate a second sample of the first signal and to output the second sample; and
      a third sample circuit coupled to the first sample circuit and to the second sample circuit, the third sample circuit configured to sample the first sample based on a change of the second sample to generate a third sample and to output the third sample; and
   an adjust circuit coupled to the phase detection circuit, the adjust circuit including an average circuit and an oscillator circuit and being configured to receive the third sample and to adjust based on the third sample, the first signal that is sampled by the first sample circuit and the second sample circuit.

10. The circuit of claim 9, wherein the first signal is a data signal and the second signal is a clock signal.

11. The circuit of claim 10, wherein a difference between the first phase of the clock signal and the second phase of the clock signal is 180 degrees such that the first sample circuit samples on one of a rising edge or a falling edge of the clock signal and the second sample circuit samples on the other of the rising edge or the falling edge of the clock signal.

12. The circuit of claim 9, wherein the first signal is approximately one-half the frequency of the second signal.

13. The circuit of claim 9, wherein the first sample circuit, the second sample circuit, and the third sample circuit each include a flip-flop, wherein a set-up and hold time for the first sample circuit and the second sample circuit are approximately the same.

14. The circuit of claim 9, wherein the change of the second sample is a change from a first logic level to a second logic level of the second sample.

15. The circuit of claim 9, wherein an average of the third sample indicates a phase difference between the first signal and the second signal.

* * * * *